United States Patent
Courcy

(10) Patent No.: US 9,564,913 B1
(45) Date of Patent: Feb. 7, 2017

(54) SYNCHRONIZATION OF OUTPUTS FROM MULTIPLE DIGITAL-TO-ANALOG CONVERTERS

(71) Applicant: ANALOG DEVICES, INC., Norwood, MA (US)

(72) Inventor: Matthew Louis Courcy, Fremont, NH (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/064,799

(22) Filed: Mar. 9, 2016

(51) Int. Cl.
| | |
|---|---|
| H03M 1/08 | (2006.01) |
| H03M 1/66 | (2006.01) |
| H03L 7/089 | (2006.01) |
| H04L 7/033 | (2006.01) |
| H03M 1/06 | (2006.01) |
| H03M 1/10 | (2006.01) |

(52) U.S. Cl.
CPC .......... H03M 1/0836 (2013.01); H03L 7/0891 (2013.01); H03M 1/0607 (2013.01); H03M 1/1009 (2013.01); H03M 1/66 (2013.01); H04L 7/033 (2013.01)

(58) Field of Classification Search
None
See application file for complete search history.

(56) References Cited

U.S. PATENT DOCUMENTS

| | | | |
|---|---|---|---|
| 5,898,325 A * | 4/1999 | Crook ................... | G06F 1/0328 327/105 |
| 7,613,971 B2 | 11/2009 | Asaka | |
| 8,392,740 B2 | 3/2013 | Dewhirst et al. | |
| 8,488,657 B2 * | 7/2013 | Wu ....................... | H04L 7/0337 375/220 |
| 9,048,847 B2 | 6/2015 | McLaurin et al. | |

OTHER PUBLICATIONS

DAC3482, Dual-Channel, 16-Bit, 1.25 GSPS Digital-to-Analog Converter (DAC), Texas Instruments, SLAS748F—Mar. 2011—Revised Aug. 2015, 106 pages.
National Instruments NI-TCIk Technology for Timing and Synchronization of Modular Instruments, Publish Date: Nov 18, 2013, www.ni.com, 12 pages.
Rich Cushing, Section 5. Reference Clock Considerations, © 1999 Analog Devices, Inc., 5 pages.
Synchronizing Multiple High-Speed Multiplexed DACs for Transmit Applications, Application Note 3901, Sep. 21, 2006, Maxim Integrated, 7 pages.

* cited by examiner

Primary Examiner — Howard Williams
(74) Attorney, Agent, or Firm — Patent Capital Group

(57) ABSTRACT

Disclosed systems include a clock-multiplying phase locked loop (PLL) generating a clock signal for a DAC comprising a plurality of DAC cells, the systems configured to control that a phase of the DAC output has a predefined relation to a phase of a PLL input reference clock. An exemplary system incorporates an auxiliary DAC cell implemented as a replica of one of the DAC cells of the DAC and operation of the DAC and the auxiliary DAC cell is timed with the same clock signal generated by the PLL, so that outputs of the auxiliary cell and the DAC are phase synchronized by design. The system is configured to ensure that a phase of the auxiliary DAC cell output is related to the phase of the PLL reference clock, which results in a phase of the DAC output also being related to the phase of the PLL reference clock.

20 Claims, 14 Drawing Sheets

SYNCHRONIZATION OF OUTPUTS FROM MULTIPLE DIGITAL-TO-ANALOG CONVERTERS

TECHNICAL FIELD OF THE DISCLOSURE

The present disclosure relates generally to digital-to-analog converters and, more particularly, to methods and systems for synchronizing outputs of multiple digital-to-analog converters.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs may be used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

Often, a DAC system includes multiple DACs, where outputs of the different DACs need to be synchronized to be within tight timing tolerances as specified by a particular application. Typically synchronicity of less than a single clock cycle of a DAC clock is required, which, in turn, means that it may be very difficult to achieve synchronization at high clock speeds since the duration of a clock cycle is inversely proportional to the clock speed. For example, with a 5 gigahertz (GHz) clock, the clock cycle is 200 picoseconds (ps) and synchronization error up to 200 ps may be acceptable, but the same application implemented with a 10 GHz clock may require that the synchronization error is less than 100 ps because that's the clock cycle at 10 GHz.

Improvements could be made with respect to synchronizing DAC outputs of multiple DACs in a system, in particular in fast clock systems.

SUMMARY OF THE DISCLOSURE

Embodiments of the present disclosure provide mechanisms for controlling the timing of the output provided by a DAC, typically in a system that include a plurality of such DACs. Disclosed systems include a clock-multiplying phase locked loop (PLL) generating a clock signal for a DAC comprising a plurality of DAC cells, the systems configured to control that a phase of the DAC output has a predefined relation to (i.e. is within a predefined phase difference, e.g. "aligned to" meaning that the phase difference is zero) to a phase of a reference clock provided as an input to the PLL. An exemplary system incorporates an auxiliary DAC cell implemented as a replica of one of the DAC cells of the DAC, where operation of the DAC and of the auxiliary DAC cell is timed with the same clock signal generated by the PLL, so that outputs of the auxiliary DAC cell and the DAC are phase synchronized (i.e. have the same phase) by design. The system is configured to ensure that a phase of the auxiliary DAC cell output is related to the phase of the PLL reference clock, which results in a phase of the DAC output also being related to the phase of the PLL reference clock.

Controlling in this manner a phase of an output of each of the main DACs that may be present within a system advantageously ensures that the outputs of the different main DACs are synchronized with respect to one another because each one of them is synchronized with respect to a common PLL reference clock.

In one aspect, a system for aligning an output of a DAC to a reference clock includes a DAC referred to herein as a "main DAC", an auxiliary DAC cell, a clock-multiplying PLL, and phase alignment means. The main DAC includes a plurality of DAC cells configured to receive digital input and generate analog output. The auxiliary DAC cell is a replica of one of the plurality of DAC cells, which can be achieved by manufacturing the auxiliary DAC cell on the same IC die, at the same time, and in relative proximity to the plurality of DAC cells of the main DAC. The PLL is configured to receive a PLL input reference clock signal (also referred to as a "PLL input clock signal" or a "PLL reference clock") and generate an output clock signal having a clock speed greater than that of the PLL reference clock signal. The output clock signal is configured to time operation of each of the plurality of DAC cells to generate an output of the main DAC and to time operation of the auxiliary DAC cell to generate an output of the auxiliary DAC cell. The phase alignment means are configured for controlling a phase of an output generated by each of the main DAC and the auxiliary DAC cell to be at a predefined phase difference from a phase of the PLL reference clock signal. In a preferred embodiment, the predefined phase difference is equal to zero, i.e. each of the output of the main DAC and the output of the auxiliary DAC cell is aligned with the PLL reference clock.

As used herein, the term "DAC cell," sometimes also referred to as "DAC unit," refers to an analog element such as a current source or a switched capacitor element that delivers an analog quantity such as charge or current. For example, a DAC cell may comprise a DAC element that includes two current sources, e.g. a pMOS and an nMOS current sources, as well as switching mechanisms associated with each of the two current sources. In another example, a DAC cell is an element that can deliver a charge Q equal to the product of a predefined reference voltage Vref and a capacitance C. The polarity of this charge is defined by the digital input to the DAC cell.

The mechanisms described herein may be applicable to any types of DACs, and may be especially attractive for military radar, medical ultrasound, 5G beamforming and other phased array type transmit DAC applications.

Because approaches described herein involve aligning a phase of an output of a DAC to a phase of a PLL input reference clock, these approaches may be referred to as "DAC-PLL phase alignment" approaches.

As will be appreciated by one skilled in the art, aspects of the present disclosure may be embodied in various manners—e.g. as a method, a system, a computer program product, or a computer-readable storage medium. Accordingly, aspects of the present disclosure related to the DAC-PLL phase alignment mechanisms may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing clock-multiplying PLLs or their controllers, etc.) or be stored upon manufacturing of these devices and systems.

Other features and advantages of the disclosure are apparent from the following description, and from the claims.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of DACs

A DAC is a device that produces a quantized (discrete step) analog output in response to a binary digital input code. The digital input may be e.g. input from transistor logic (TTL), emitter-coupled logic (ECL), complementary metal-oxide-semiconductor (CMOS) circuits, or low-voltage differential signaling (LVDS), while the analog output may be either a voltage or a current. To generate the output, a reference quantity (either a voltage or a current) is divided into binary and/or linear fractions. Then the digital input drives switches to the individual DAC cells of a DAC, the individual DAC cells comprising current sources, voltage sources, resistors, capacitors, etc. that produce a certain output in response to a certain input driving them. A DAC combines an appropriate number of these fractions to produce the output, a process sometimes referred to as "encoding." The number and size of the fractions reflect the number of possible digital input codes, which is a function of converter resolution or the number of bits (N) in the digital input code. For example, N bits could result in $2^N$ possible codes.

Often, a DAC system includes many such DACs, where outputs of the different DACs need to be synchronized with respect to one another. Embodiments of the present disclosure relate to such synchronization.

Issues of DAC Synchronization

Two or more DACs may be described as "synchronized" when the outputs of these DACs are aligned to one another in time. When the outputs of two DACs are perfectly aligned, the two DACs are referred to as having a phase difference of zero.

Figure 1:
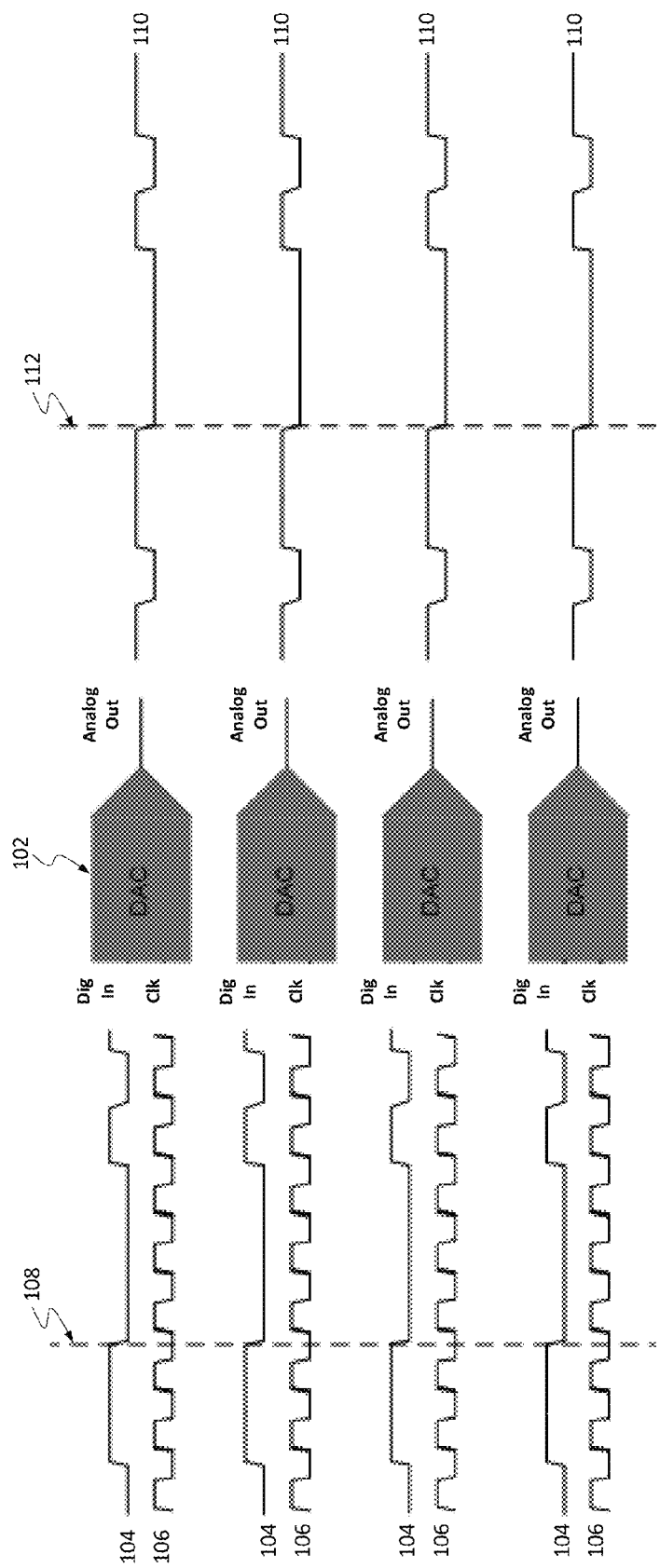
FIG. 1 illustrates a DAC system with aligned input data and synchronized DAC outputs.

One simple test to determine whether several DACs are synchronized includes applying the same digital signal to all DACs in a system and observe the outputs. If the outputs from all DACs look identical and aligned, then the system is synchronized. FIG. 1 illustrates a DAC system with aligned input data and synchronized DAC outputs. FIG. 1 depicts an exemplary case of four simple 1-bit DACs 102, where digital input for each DAC (indicated with reference numeral 104) is perfectly aligned, as illustrated in FIG. 1 with a dashed line 108 extending through the same digital input value in each of the digital inputs. Reference numeral 106 indicates an input clock signal to the DAC. Analog output of each DAC (indicated with reference numeral 110) is also perfectly aligned, as illustrated in FIG. 1 with a dashed line 112 extending through the same analog output value in each of the analog inputs.

However, in real-world signal processing DACs, there are many sources of misalignment. One is that the digital data leaving the data source to be provided as input to DACs is not always aligned. This case of misalignment is illustrated in FIG. 2.

Figure 2:
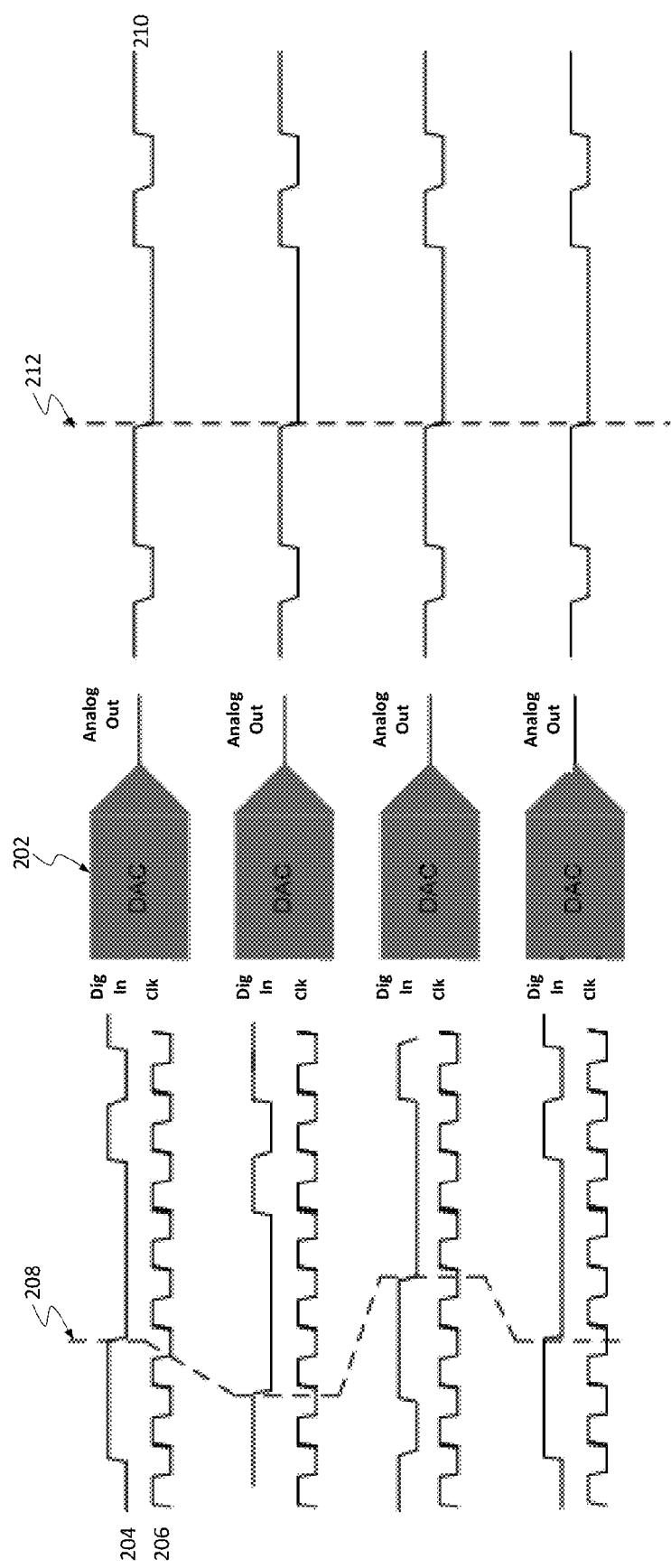
FIG. 2 illustrates a DAC system with misaligned input data and synchronized DAC outputs.

FIG. 2 differs from FIG. 1 in that the digital input data 204 to the four DACs 202 is misaligned, as shown with a dashed line 208. FIG. 2 also illustrates that the clocks for the DACs 202 are still matched, as shown with aligned clock signals 206. Furthermore, FIG. 2 illustrates that there are standard methods that allow adjusting the DACs so that the output data is identically aligned even when the input data is not aligned, as shown with the analog output data 210 of the four DACs 202 being aligned, indicated with a dashed line 212.

Figure 3:
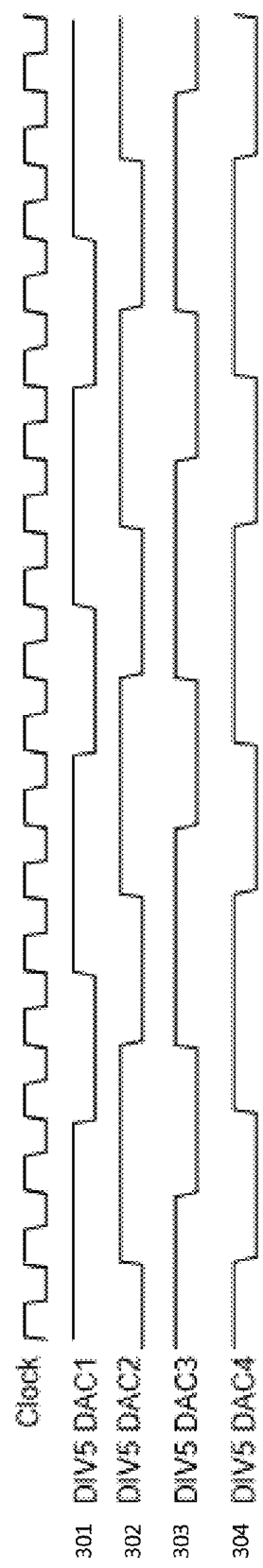
FIG. 3 illustrates unsynchronized DAC clock dividers.

Another source of misalignment is associated with the DAC itself. For example, in interpolating DACs, the input clock is often divided down to the data input rate. Data may enter the interpolating DAC system at X Mhz and be sampled to the DAC output at Y Mhz, where Y is typically larger than X by an integer factor. In order to develop X within the DAC, a divider is needed, i.e. a circuit that takes an input signal of one frequency and generates an output signal of another frequency. This input signal to a divider does not always start at the same time between different DACs in an interpolating DAC system, as shown in FIG. 3 with misaligned divider input signals 301-304 for corresponding DACs indicated as DAC1-DAC4, leading to misalignment of the divider outputs. When dividers to different DACs (DAC1-DAC4) are not synchronized, the data into the DACs enters the digital interpolators at different times. Since an interpolator is a fixed latency object, if data enters different interpolators at different times, the data exits the interpolators into the DACs at different times causing the analog DAC outputs to be unsynchronized.

Figure 4:
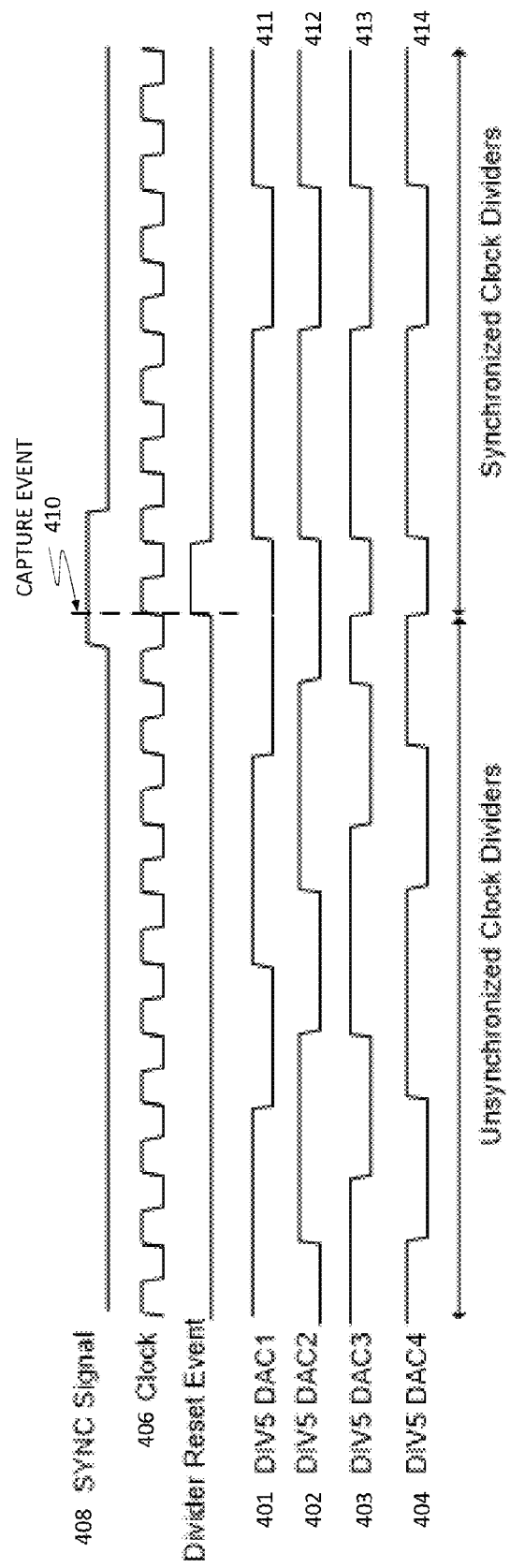
FIG. 4 illustrates using a SYNC signal to synchronize unsynchronized DAC clock dividers.

To solve the issue shown FIG. 3, DAC designs have introduced the requirement of a synchronization signal (SYNC signal) that is provided to each DAC alongside the clock signal. The clock signal is used to capture the transition of the SYNC signal and create a time event. This event, in turn, is used to reset the divider of the DAC. After the reset, all dividers are aligned so data enters and exists the interpolators aligned from DAC to DAC, ensuring a measure of synchronization. This scenario is shown in FIG. 4, where, initially, DAC dividers 401-404 of the 4 different DACs are unsycnrhonized. A clock signal 406 is used to capture the transition of a SYNC signal 408 and create a time event 410 which is then used to reset the dividers 401-404, resulting in synchronized dividers 411-414, respectively.

Now that the DAC internal clocks are aligned, the system can align the digital data coming from the data source to the DACs in the system to produce synchronized DAC outputs. Digital input data can be misaligned due to various reasons, such as e.g. inaccuracies in the starting points in the digital transmission system, clock positions, clock crossings, and divider resets. In order to align the digital data later in the path, specifically in the DAC, a timestamp is sent to the DAC along with the data. This timestamp may be aligned to the internal clock of the DAC inside the DAC using a First in First Out (FIFO) data structure. The data flows into the FIFO starting at the timestamp and flows out based on the internal clock of the device, which allows all timestamps to be aligned in the already aligned internal clock dividers, effectively synchronizing the data.

With the ability to align the internal clocks and the digital input data, multiple DACs in a system could be expected to be synchronized. Unfortunately, in practice, this is not the case. In real-world systems, there are numerous issues that present themselves to thwart these synchronization attempts. What makes aligning a clock and a synchronization signal in a real-world system especially difficult is that oftentimes circuitry varies with process (P), supply voltage (V), and temperature (T) (together sometimes referred to as "PVT" variations). PVT variations between different circuit elements result in time differences, i.e. phase shifts, between signals traversing paths containing those circuit elements. Consequences of that may be described with reference to FIGS. 5-7.

Figure 5:
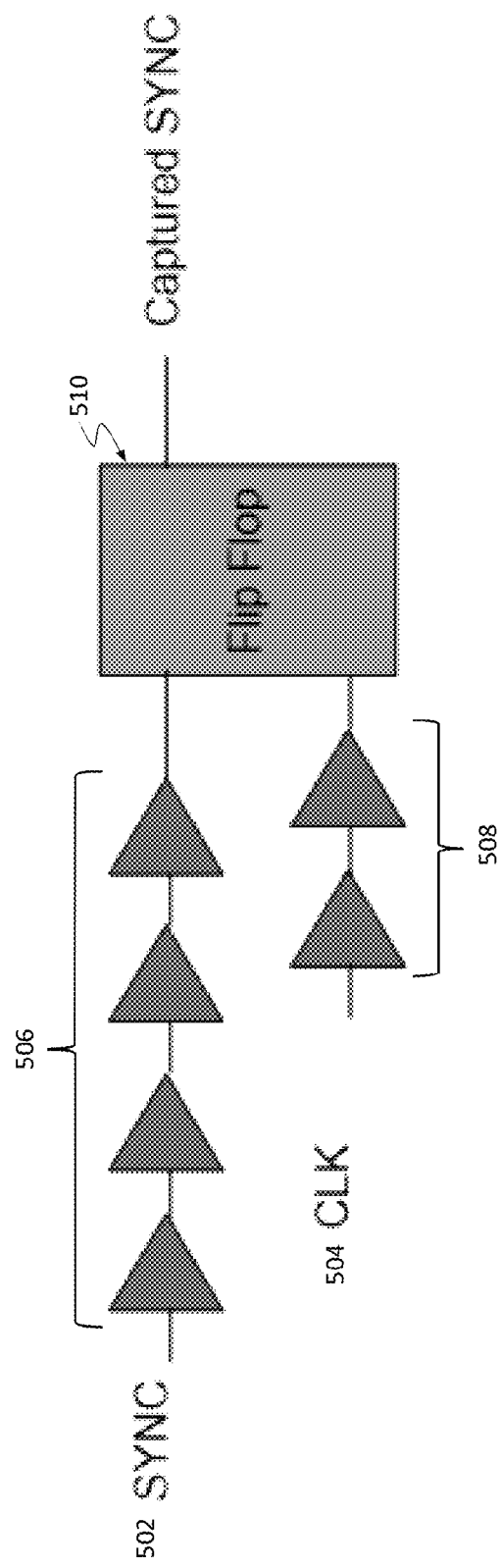
FIG. 5 illustrates differences in paths for synchronization and clock signals.

FIG. 5 illustrates differences in paths for synchronization and clock signals, indicated in FIG. 5 as signals 502 and 504, respectively. The SYNC signal 502 is captured by a flip flop (FF) 510 using the clock signal 504, which is done in a manner as described above with reference to FIG. 4. If the SYNC signal 502 and the CLK signal 504 are sufficiently well aligned as they arrive at the flip flop 510, a clean capture takes place, which is the desired behavior. However, signals 502 and 504 are not always aligned that well. As depicted in FIG. 5, the SYNC and CLK paths 506 and 508, respectively, can be made of different number of buffers, shown in the example of this figure with four buffers in the SYNC path 506 and two buffers in the CLK path 508. Even though the SYNC signal and the CLK signal may be reasonably well aligned when they are provided to a particular chip where SYNC signal is to be captured, due to the buffers 506 and 508 being of different lengths and due to PVT variations in the buffers 506 and 508, by the time the SYNC and the CLKC signals arrive at the flip flop 510, one of them could be delayed with respect to the other. Just how much of this delay difference between the paths 506 and 508 can be acceptable depends on the clock speed, where the higher the clock speed the lower is the tolerance for this delay difference, as illustrated in FIGS. 6 and 7.

Figure 6:
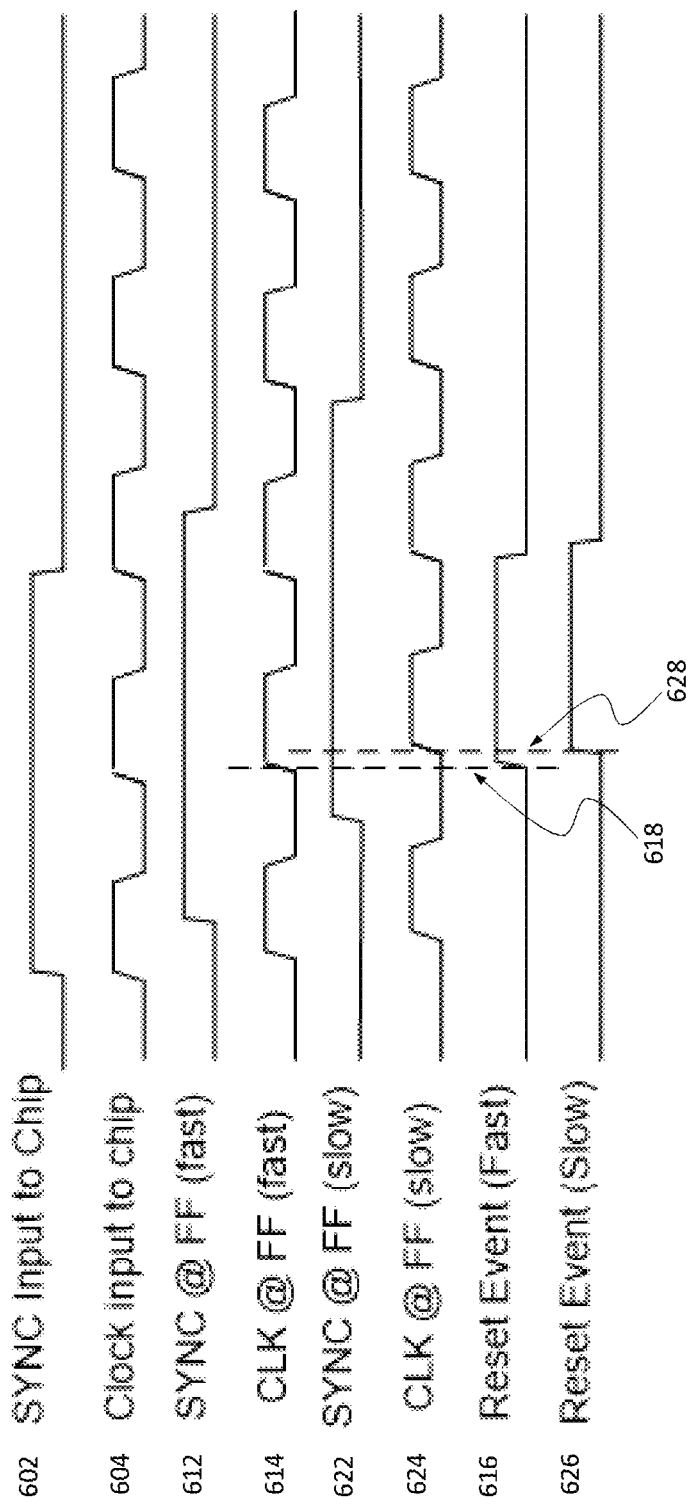
FIGS. 6 and 7 illustrate timing differences in capturing a SYNC signal using a relatively slow clock signal and a relatively fast clock signal, respectively.
Figure 7:
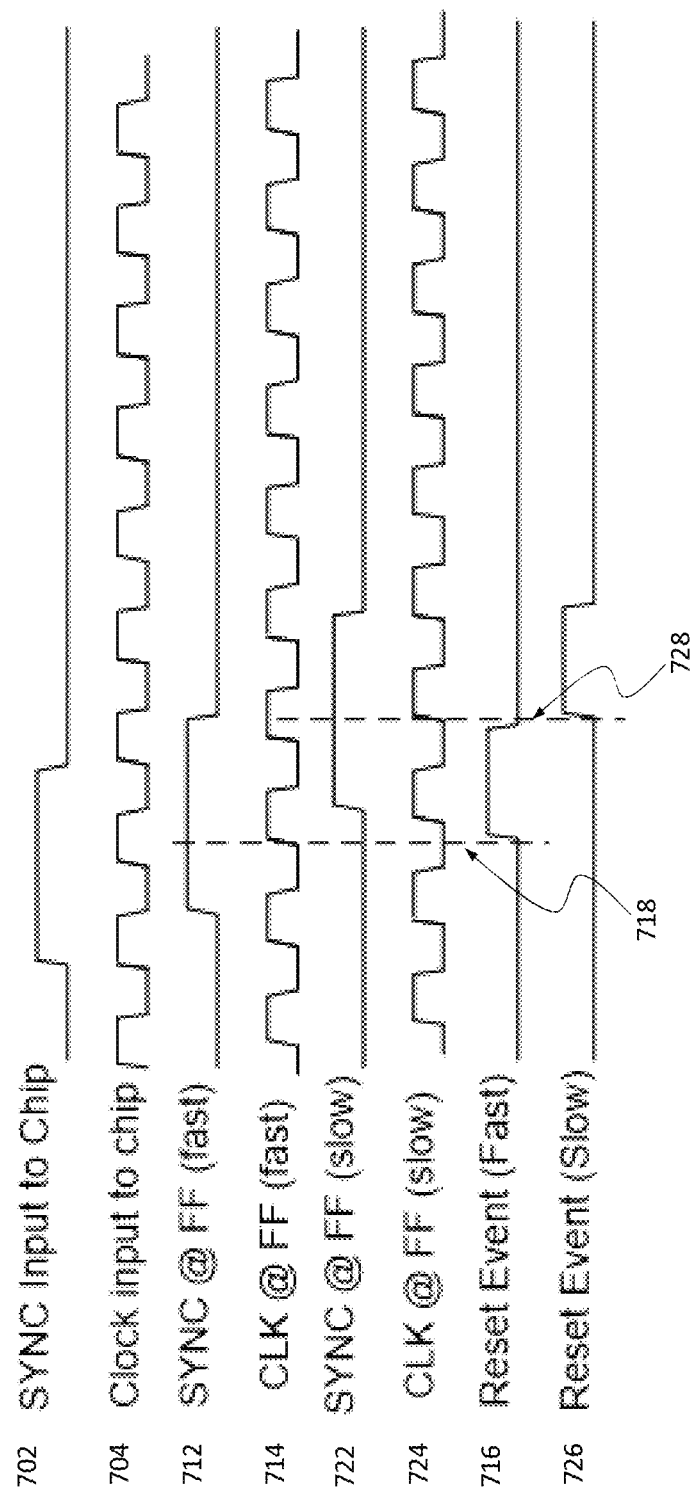

FIGS. 6 and 7 illustrate timing differences in capturing a SYNC signal using a relatively slow clock signal and a relatively fast clock signal, respectively. A set of waveforms shown in FIG. 6 illustrates an exemplary input SYNC signal 602 and an exemplary input CLK signal 604, as those signals are provided to a chip (i.e. before the signals traverse their respective paths to arrive at a flip flop that captures the SYNC signal. FIG. 6 further illustrates an exemplary SYNC signal 612 as it arrives at the flip flop and an exemplary CLK signal 614 as it arrives at the flip flop, both of these signals shown for an exemplary case that PVT variations do not cause much delay to the input signals 602 and 604 to arrive at signals 612 and 614. In the following description, PVT variations that introduce less delay to the input signals relative to PVT variations that cause more delay to the input signals are referred to as "fast" PVT variations, whereas the PVT variations that introduce relatively more delay to the input signals are referred to as "slow" PVT variations. Thus, the terms "slow" and "fast" in this context represent that some PVT variations (i.e. the slow PVT variations) slow down the input signals more than others (i.e. the fast PVT variations). Signals 612 and 614 are labeled in FIG. 6 as signals for the case of "fast" PVT variations.

On the other hand, an exemplary SYNC signal 622 and an exemplary CLK signal 624 arriving at the flip flop are shown for an extreme case that PVT variations cause a relatively large delay to the input signals 602 and 604 to arrive at signals 622 and 624 (that's why signals 622 and 624 are labeled as "slow" in FIG. 6). Waveforms 616 and 626 illustrate reset events for the cases of fast and slow PVT variations, respectively. Dashed lines 618 and 628 illustrate divider reset timing for the cases of fast and slow PVT variations, respectively (similar to the illustration of a reset event with the line 410 in FIG. 4).

FIG. 7 illustrates signals 702, 704, 712, 714, 722, 724, 716, and 726 analogous to those shown in FIG. 6 but for the scenario for input signals which are faster (i.e. higher clock rate) than the input signals of FIG. 6.

Analysis of the waveforms shown in FIGS. 6 and 7 reveals that, between an input to the chip and a capture FF, the input clock signal does not delay much, but the SYNC signal does, which is a result of the SYNC signal provided to the chip traversing larger number of buffers than the CLK signal. The sets of waveforms shown in FIGS. 6 and 7 show that the SYNC capture is based on the same clock edge in both cases. In the illustration of FIG. 6, clock divider reset events 618 and 628 are close to one another. However, in the illustration of FIG. 7, the input clock 704 is twice as fast as that in FIG. 6, and the relative shift in SYNC and CLK waveforms is more than on clock cycle. This causes the reset pulse for the fast case (i.e. reset event 718) to happen one full clock period before the slow case (i.e. reset event 728). The prevailing wisdom is that it becomes very difficult to get an accurate signal capture on the SYNC signal about 1 gigahertz (Ghz). When building a DAC with a sample rate greater than 10 Ghz, the SYNC capture method becomes useless.

In addition to the inability to accurately capture the SYNC signal on the same clock across several devices in a system, many user systems are beginning to require that, once the DACs are initially reset, e.g. by resetting the DAC dividers as described above, that the delay of any of these DACs does not drift more than a certain amount over time. As was illustrated in FIGS. 6-7, the difference between slow PVT and fast PVT can be substantial. Considering that many clocked circuits today have substantial circuitry between the clock input and the DAC output switch, the PVT variations between slowest and fastest conditions may become substantially longer than the user specification. For example, if a group of devices are set up and accurately reset at low temperature, the slower PVT devices will see much larger shifts in clock path delay than the fast PVT devices. This leads to a lack of synchronization at the DAC output even though input clocks may be well aligned. This is illustrated in FIG. 8.

Figure 8:
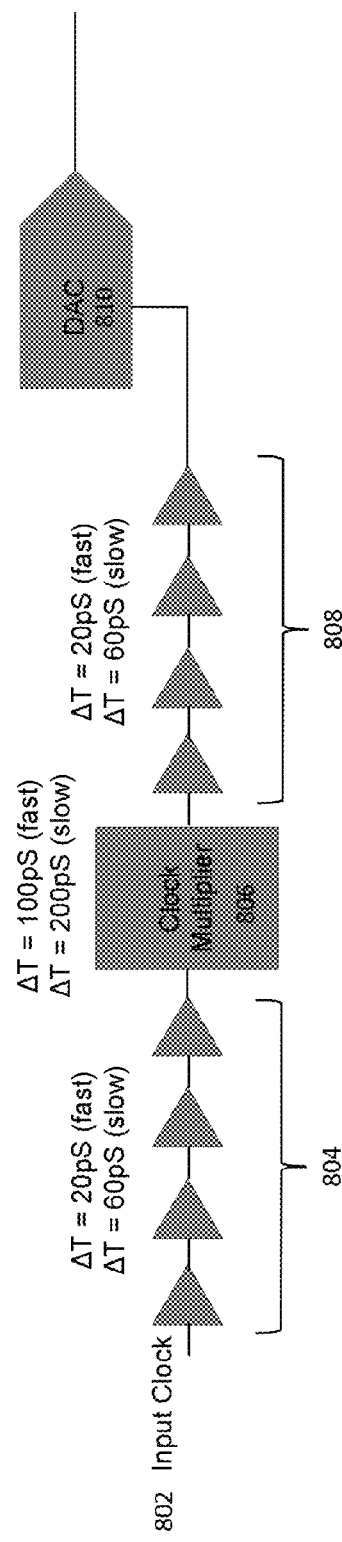
FIG. 8 illustrates drift effects on DAC synchronization.

FIG. 8 illustrates drift effects on DAC synchronization. In FIG. 8, the circuit considered is a clock path for a DAC. As shown, a clock path for an input clock signal 802 has a number of buffers 804, a clock multiplier 806, and some more buffers 808 before the clock signal being provided to a DAC 810. Consider that the variance of the delay, from fast to slow PVT variations, for the two buffer chains 804 and 808 is 40 pS, and 100 pS for the clock multiplier 806. Assuming the system was synchronized at a relatively low temperature when PVT variations do not introduce much delay (i.e. fast PVT variations), and then the temperature increased, changing the situation so that PVT variations introduce more delay (i.e. now the PVT variations are slow PVT variations), the difference between a fast and slow DAC could be as much as 180 pS (40 pS due to the buffers 804, plus 100 pS due to the clock multiplier 806, plus 40 pS due to the buffers 808). Since a DAC clock is 100 pS at 10 Ghz, this results in greater than one DAC clock cycle of asynchronicity.

Figure 9:
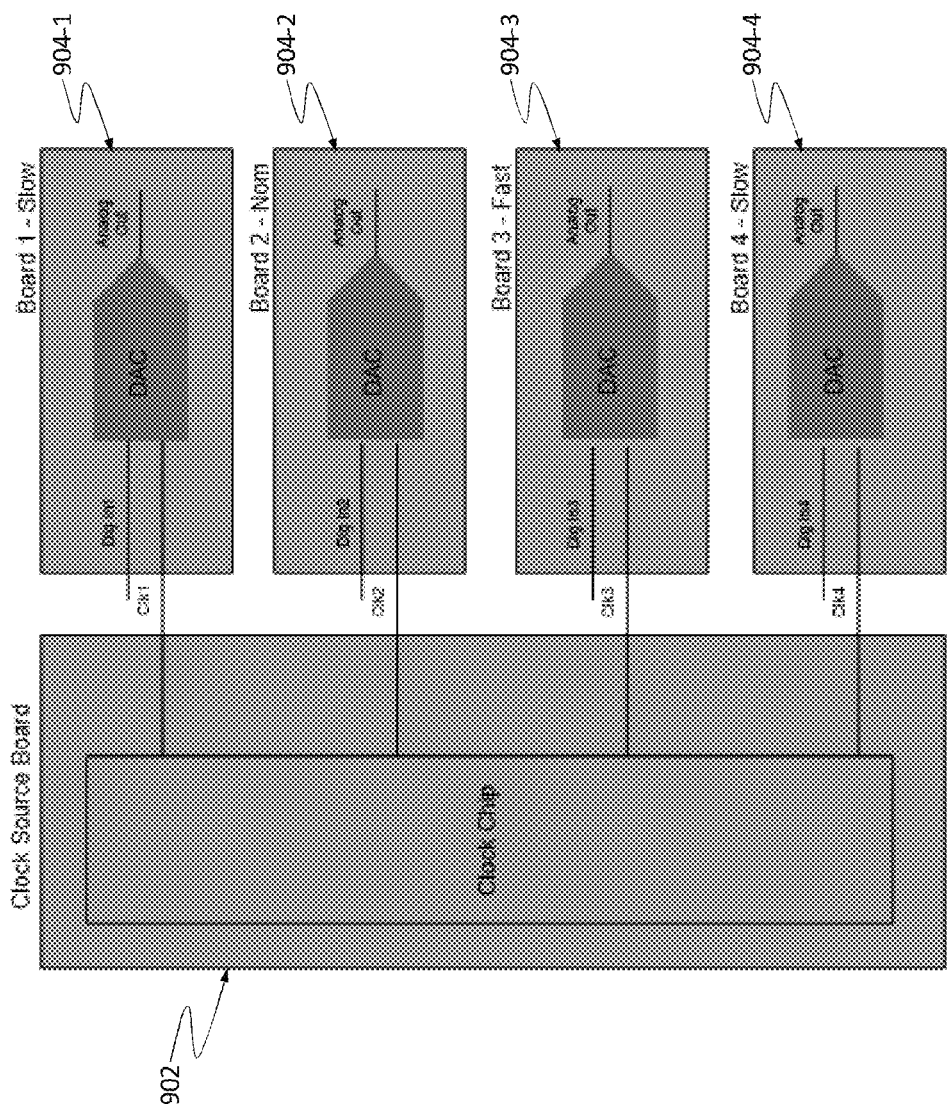
FIG. 9 illustrates clock signals provided to DACs implemented on different boards.

Oftentimes, a system may include several DACs implemented on different boards or/and different chips. The different boards may, and in fact are likely, to be characterized by different PVT variations, e.g. because the boards may heat differently. Even when implemented on a single board, DACs implemented on different chips provided on a single board may be characterized by different PVT variations. As a result, clock signals generated at a fixed reference point, typically on another board or chip, and provided to these DACs may exhibit quite different drifting behavior from one DAC to another. This situation is schematically illustrated in an example shown in FIG. 9, where a clock source board 902 comprising a clock chip is used to provide a clock signal to four different boards 904-1 through 904-4 (individual clock signals to Boards 1-4 are shown as Clk1, Clk2, Clk3, and Clk4, respectively). Example shown in FIG. 9 illustrates that Boards 1 and 4 may be characterized by slow PVT variations (which, in the worst case, could also be different with respect to one another), Board 3 may be characterized by fast PVT variations, while Board 2 may be characterized by nominal PVT variations (i.e. PVT variations that are between "fast" and "slow").

The above description shows that, without some sort of real-time calibration, it is very difficult to keep the phases of the outputs of the different DACs aligned (i.e. to keep the DACs synchronized). Therefore, what is needed is a solution for making sure that DAC output of different DACs is well aligned to some static, master, timing reference in the system. For a single DAC, such master timing reference is the input clock provided to it. If the system can maintain the phases of the input clocks being provided to different DACs and each DAC can align its output to its input clock, then phase differences can be held relatively constant and the effects of drift in the DACs can be reduced. Furthermore, a solution should preferably be based on using relatively slow clock signals because, as described above, using fast clock signals reduces tolerances in successfully capturing synchronization signals and increases power consumption due to routing of such signals to different parts of the system.

Clock-multiplying Phase Locked Loops (PLLs) provide such a solution by allowing a synchronization signal to be captured by a relatively slow input clock, e.g. on the order of several 100 Mhz, and then passed to a higher speed clock inside a DAC. Operation of such a PLL is described in the following section.

Clock-Multiplying PLLs

Using on-board PLL-based clock multipliers, which is an alternative name for clock-multiplying PLLs, is the way design is moving for one key reason. Sample rates for high speed DACs are increasing to push digital bandwidth and performance closer to those of the antennas. It is particularly difficult to transmit high speed clock signals around a board without burning significant power and generating high spurious noise. Local (i.e., on-board) PLLs bridge the gap between reasonable rate board level clocks of several 100's of Mhz and new DAC or ADC sample clocks of several Ghz. Considering again the waveforms in FIGS. 6 and 7, it is easier to capture a synchronization signal with a clock slower than 1 Ghz than with a faster clock.

Figure 10:
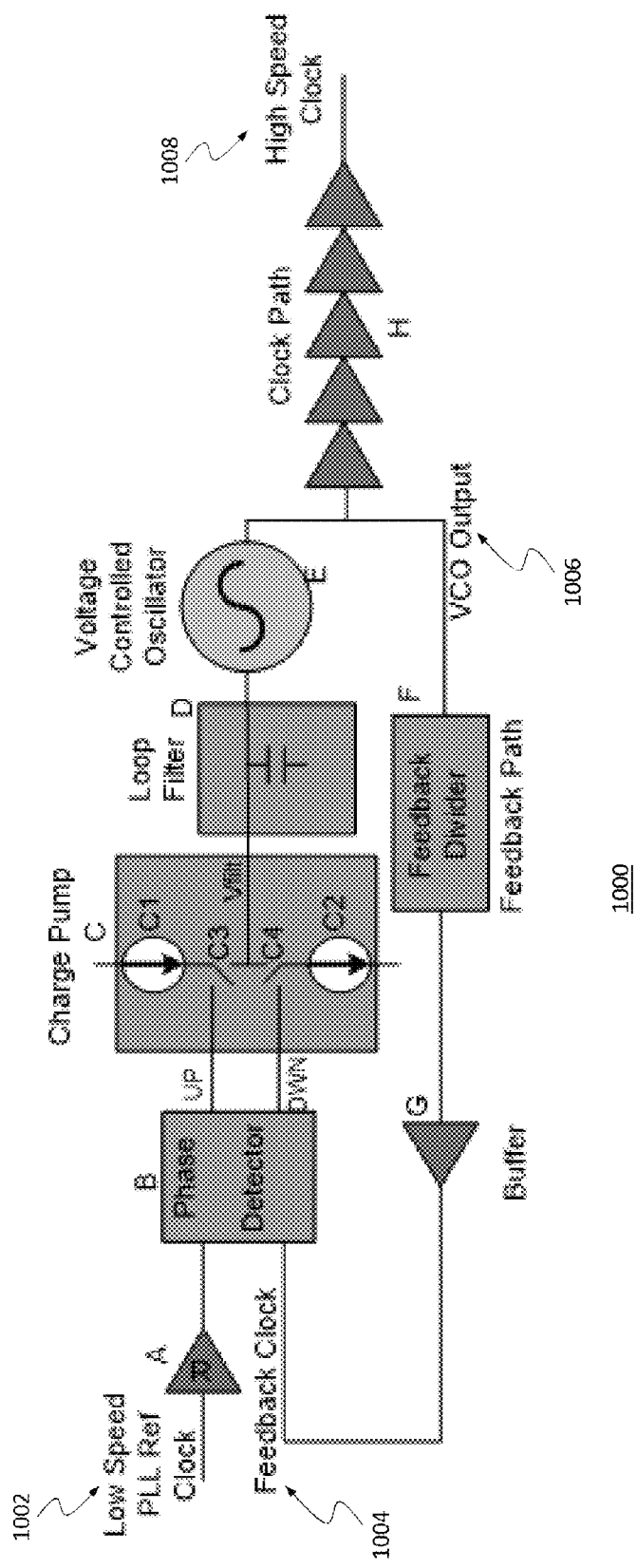
FIG. 10 illustrates a conventional PLL-based clock multiplier.
Figure 11:
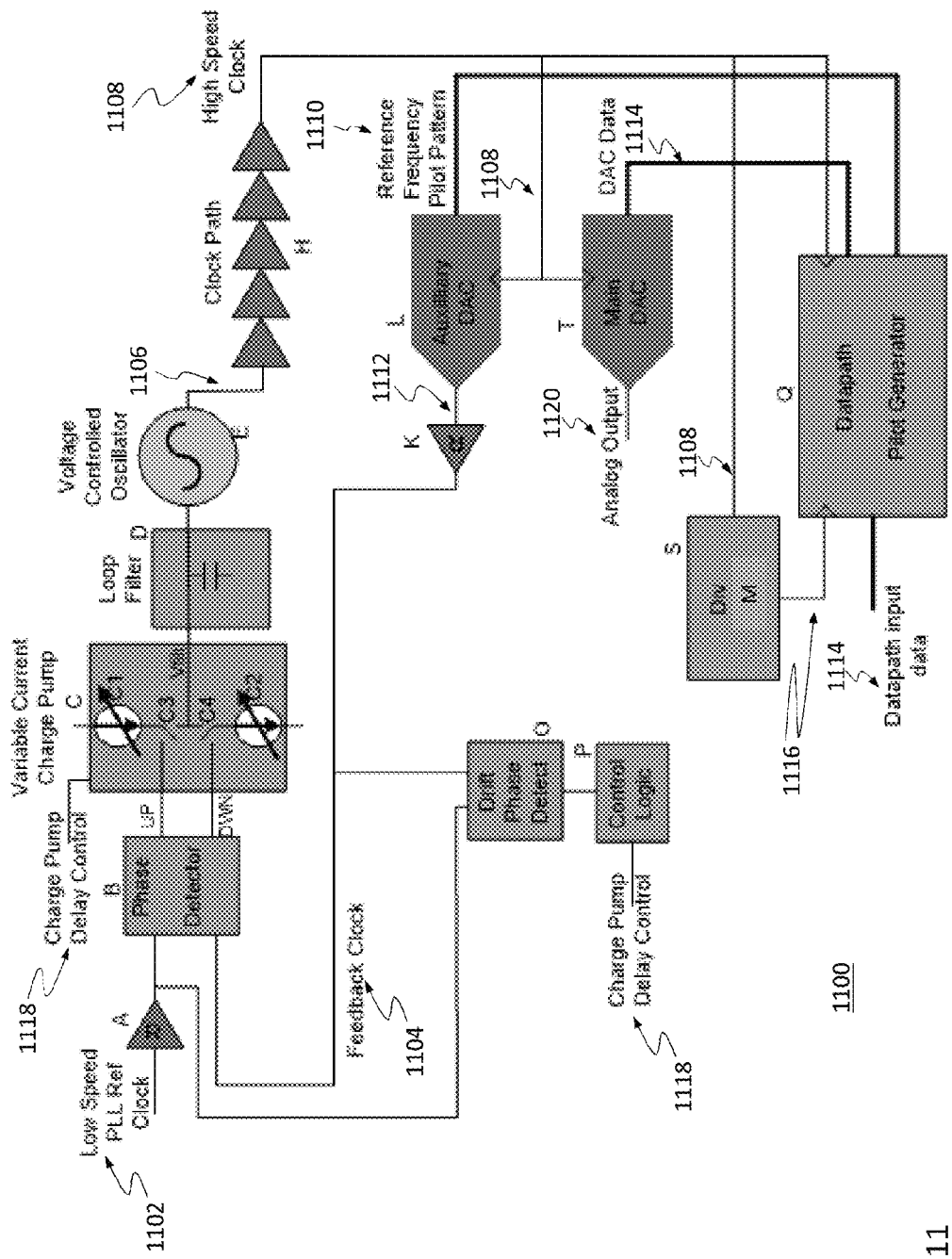
FIG. 11 illustrates a PLL-based clock multiplier, according to one embodiment of the present disclosure.
Figure 12:
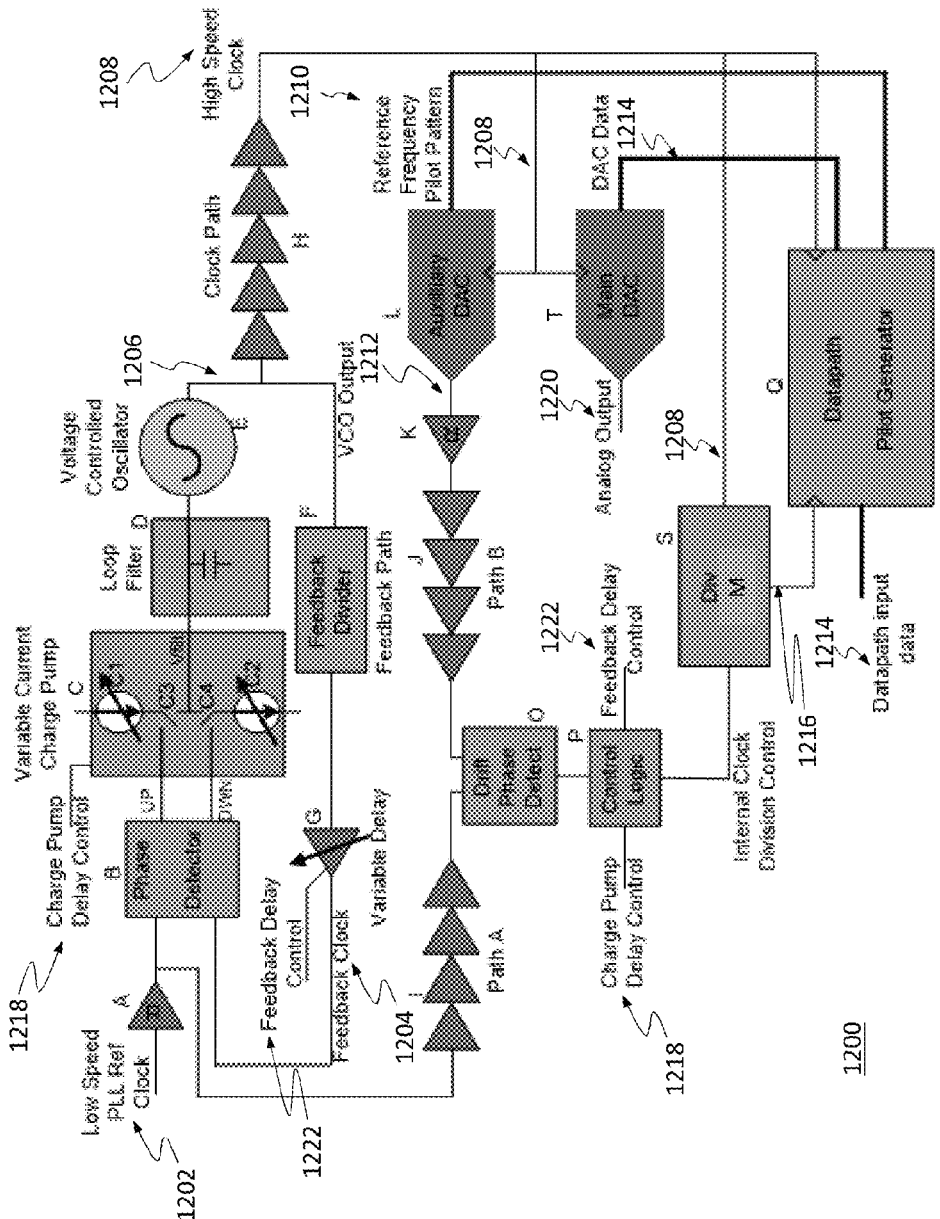
FIG. 12 illustrates a PLL-based clock multiplier, according to another embodiment of the present disclosure.

FIG. 10 illustrates a conventional clock-multiplying PLL 1000 and its components. In FIG. 10, as well as in FIGS. 11 and 12, each of the components are indicated with a letter instead of a reference numeral because such indication is more concise compared to four digit reference numerals such as 1002, etc, especially when clock-multiplying PLLs with even more components, in accordance with embodiments of the present disclosure, are shown in FIGS. 11 and 12. Various signals, such as e.g. low speed and high speed clock signals, DAC data signal, etc. are indicated in FIGS. 10-12 with reference numerals. In FIGS. 10-12, the same reference letters and similar reference numerals indicate similar or analogous components or signals.

As shown in FIG. 10, a conventional clock-multiplying PLL 1000 receives a low speed PLL reference clock signal 1002 and provides it to an input buffer A. The input buffer A couples the PLL reference clock 1002 to a phase detector B. The phase detector B compares the phase of the coupled reference clock 1002 with the phase of a PLL feedback clock 1004 and, as a result of the comparison, generates and provides to a charge pump C an UP pump signal indicated as "UP" and a DOWN pump signal indicated as "DWN". The charge pump C converts the difference between the UP and DWN signals to a charge by actuating two current switches C3 and C4 respectively steering currents C1 and C2. This charge is deposited onto a filter of the PLL 1000 denoted as a "loop filter D". The loop filter input, shown in FIG. 10 as "Vfilt", is a sum of many such charges sent to the loop filter D. An output signal of the loop filter D is a voltage signal Vfilt from which the higher-frequency components have been removed (as is well known, a loop filter of a PLL is a low-pass filter). The output of the loop filter D is coupled to a Voltage Controller Oscillator (VCO) E where it determines the oscillation frequency of the VCO. In particular, the VCO E generates a clock signal, shown as VCO output 1006, based on the input voltage received from the loop filter D. The frequency of the VCO output signal 1006, $f_{VCO}$, is M times higher than the frequency of the PLL reference clock signal 1002, $f_{REF}$, where M is a value greater than 1:

$$f_{VCO} = M * f_{REF}$$

Thus, the PLL 1000 effectively multiplies the frequency of the reference input clock, $f_{REF}$, by M, justifying the name "clock-multiplying PLL".

The VCO output signal 1006 is coupled to a clock path H, thus providing a high speed clock signal 1008. In this context, terms "low speed" and "high speed" reflect that the frequency of the clock signal 1008 is M times higher than that of the clock signal 1002.

The clock path H is a series of buffers, shown as triangles, needed to transfer the clock signal from the VCO to its target circuitry, e.g. to a DAC (not shown in FIG. 10). The triangles shown in the clock path H in FIG. 10, as well as similar triangles shown in other paths in this FIGURE and in FIGS. 11-12, represent phase delays introduced to respective signals as a result of traversing the paths.

The VCO output signal 1006 is also coupled to a feedback divider F provided in a feedback path of the PLL. The feedback divider F is used to divide the VCO clock signal 1006 by a factor M and produce the feedback clock 1004 provided as one of the inputs to the phase detector B. A buffer G shown in FIG. 10 represents a buffer needed to transfer the frequency divided signal from the output of the feedback divider F to the phase detector B over the feedback path of the PLL 1000. As is well known, the action of the PLL works to force the phase and frequency of the phase detector inputs, i.e. clock signals 1002 and 1004, to match. Any phase deviation between the inputs to the phase detector B causes a change in VCO frequency and a shift in a feedback phase to compensate for it.

In a manner of speaking, by controlling the frequency of the VCO, the PLL tracks the drift of the VCO and matches it to the input reference. This behavior is desirable. However, currently, the advantages of using clock-multiplying PLLs, such as the PLL 1000, are offset by the fact that, due to the presence of its many analog components, a PLL typically has a PVT drift that is larger than that of standard logic, resulting in high initial accuracy but more drift and less accuracy relative to environment. For example, for the PLL shown in FIG. 10, drift components include the delays of elements A, G, F, and H, and path differences for the clock signals provided to the phase detector B. Because elements A and H are in the forward clock path, more delay through these components lead to more delay from input to output. Because elements F and G are in the feedback path of the PLL, any lengthening of their delay leads to a shortening of delay from input to output. The environmental based changes of the currents C1 and C2 can also lead to phase drift which the PLL does not directly compensate.

As the foregoing illustrates, what is needed in the art is a way to use PLL-based clock multipliers while limiting their phase drift due to PVT variations.

DAC-PLL Phase Alignment Approaches: Improvements in Using Clock-Multiplying PLLs Embodiments of the present disclosure are based on an insight that, despite the disadvantages described above, PLLs have a behavior which is particularly well suited to tracking drift and that this behavior could be appropriately exploited. In particular, embodiments of the present disclosure are based on recognition that, in a system that includes a clock-multiplying PLL generating a high speed clock signal for a DAC comprising a plurality of DAC cells configured to receive digital input and generate analog output (such a DAC referred to herein as a "main DAC"), the system may be configured to control that a phase of the DAC output stays within a predetermined difference from a phase of a PLL reference clock (e.g. the predetermined difference could be zero, indicating that phase of the DAC output and the phase of the PLL reference clock are aligned). To that end, each of the systems employing clock-multiplying PLLs described herein incorporates an auxiliary DAC cell implemented as a replica of one of the DAC cells of the main DAC, which can be achieved by manufacturing an auxiliary DAC cell on the same Integrated Circuit (IC) die, at the same time, and in relative proximity, on the IC die, to the plurality of DAC cells of the main DAC. Operation of the auxiliary DAC cell and of the main DAC is timed with the same high speed clock generated by the voltage controlled oscillator of the PLL and input data signals to the auxiliary DAC cell and of the main DAC are aligned. As a result, outputs of the auxiliary DAC cell and the main DAC are phase synchronized by design. The systems described herein are configured to ensure that a phase of the output of the auxiliary DAC cell is related (i.e. is within a predefined phase difference, e.g. "aligned to" meaning that the phase difference is zero) to a phase of the PLL reference clock. Since the outputs of the auxiliary DAC cell and the main DAC are phase synchronized as a result of the auxiliary DAC cell being a replica of one of the DAC cells and both the auxiliary DAC cell and the main DAC being clocked with the same clock signal, making the phase of the output of the auxiliary DAC cell related to the phase of the PLL reference clock results in the phase of the main DAC being related to the phase of the PLL reference clock in the same manner as that of the auxiliary DAC cell, thus ensuring that the phase of the main DAC output is related to the phase of the PLL reference clock. This is in stark contrast to prior art implementations of clock-multiplying PLLs where there is absolutely no relation between the phase of the PLL input reference clock and the phase of the DAC output.

In some embodiments (solution #1 described below), the auxiliary DAC cell is included within the forward path of the PLL. Consequently, the action of the PLL ensures that a phase of the output of the auxiliary DAC cell is related to the phase of the PLL reference clock, since generating an output signal whose phase is related to the phase of an input signal is the nature of a PLL.

In other embodiments (solution #2 described below), a phase of an output of the auxiliary DAC cell having traversed a delay matched replica of the reference feed-forward path is compared to a phase of a PLL reference clock having traversed the reference feed-forward path to detect a drift in phase and, based on the amount of the detected drift parameters of the PLL (e.g. currents in the charge pump and/or the variable delay) are adjusted, thus adjusting the high speed clock generated by the PLL. This also results in that a phase of the output of the auxiliary DAC cell is related to the phase of the PLL reference clock.

Controlling, in this manner, a phase of an output of each of the main DACs present within a system advantageously ensures that the outputs of the different main DACs are synchronized with respect to one another because each one of them is synchronized with respect to a common PLL reference clock.

In case multiple main DACs need to be synchronized as described herein for a single DAC, then a separate auxiliary DAC cell may be implemented for each of such main DACs since the different main DACs may differ, even slightly, in their DAC cells and an auxiliary DAC cell provided as a replica of one of the DAC cells of one main DAC may not be a replica of one of the DAC cells of another main DAC.

Proposed systems allow compensating for the drift introduced by various components of a clock-multiplying PLL while still benefiting from the advantage that a relatively high-speed clock signal is generated right before the clock signal is used to time the operation of a DAC, thus reducing transmission of high speed clock signals on an IC chip.

Solution #1: Auxiliary DAC Cell Embedded in Clock-Multiplying PLL

FIG. 11 illustrates a system 1100 comprising an improved clock-multiplying PLL with phase compensation, according to one embodiment of the present disclosure. The improved clock-multiplying PLL of the system 1100 comprises a PLL such as the one shown in FIG. 10 except that the divider feedback path of the PLL of FIG. 10 is now replaced by a replica DAC path. General operational principles of a clock-multiplying PLL as provided above with reference to FIG. 10 are applicable to the PLL of FIG. 11 and, therefore, in the interest of brevity are not repeated in all details. Rather, modifications to the PLL of FIG. 10 are described.

Similar to FIG. 10, FIG. 11 illustrates that a clock-multiplying PLL receives a low speed PLL reference clock signal 1102 and provides it to an input buffer A which couples the PLL reference clock 1102 to a phase detector B. The phase detector B compares the phase of the coupled reference clock 1102 with the phase of a PLL feedback clock 1104 and, as a result of the comparison, generates and provides to a charge pump C an UP pump signal indicated as "UP" and a DOWN pump signal indicated as "DWN". The charge pump C converts the difference between the UP and DWN signals to a charge by actuating two current switches C3 and C4 respectively steering currents C1 and C2. Unlike FIG. 10, the charge pump C of the system 1100 of FIG. 11 may be a variable current charge pump controlled by a charge pump control signal 1118 described in greater detail below.

Similar to FIG. 10, the charge generated by the charge pump of FIG. 11 is deposited onto a loop filter D and the output of the loop filter D is coupled to a Voltage Controller Oscillator (VCO) E where it determines the oscillation frequency of the VCO. Also similar to FIG. 10, the VCO E of FIG. 11 generates a VCO output clock signal, shown as a an output 1106, based on the input voltage received from the loop filter D, where the frequency of the VCO output signal 1106, $f_{VCO}$, is M times higher than the frequency of the PLL reference clock signal 1102, $f_{REF}$, the VCO output signal 1106 being coupled to a clock path H, thus providing a high speed clock signal 1108 that has frequency that is M times higher than that of the PLL input reference clock signal 1102.

In contrast to FIG. 10, there is no feedback divider in the PLL of FIG. 11. Instead, the feedback divider path is replaced by a replica DAC path that includes an auxiliary DAC cell L and a replica receiver buffer K which is delay matched to the receiver buffer A. In addition, the system 1100 further includes the main DAC T, the phase of the output of which is to be aligned to the PLL reference clock and a datapath pilot generator Q. Optionally, the system 1100 may also include a drift phase detector O and a drift compensation control logic P, as well as a divider S. Functionality of these elements will now be described.

The receiver buffer K is a replica of the receiver buffer A in that it is manufactured in the same manner, at the same time, on the same die, and in relative proximity to the receiver A in order to re-create delay introduced to the PLL reference clock signal 1202, but for the output of the auxiliary DAC cell.

The auxiliary DAC cell L is a replica of one of the DAC cells of the main DAC. This means that, as the main DAC is manufactured, having e.g. 50 DAC cells, an additional DAC cell is provided at the same time, on the same die, and in relative proximity to those DAC cells (e.g. within a few hundred micrometers to the DAC cells), resulting in an arrangement of 51 DAC cells. Because the auxiliary DAC cell and the DAC cells are manufactured in this manner, they may only have negligible, if any, differences in their PVT variations. Therefore, when operation of the auxiliary DAC cell and of the main DAC is timed with the same clock signal and when input data signals to the auxiliary DAC cell and of the main DAC are aligned (i.e. synchronized), their outputs will be phase aligned as well (i.e. there will not be any phase difference in their outputs due to different drifts of their components). Thus, such an auxiliary DAC cell and the main DAC may be said to be phase synchronized "by design".

Even though the auxiliary DAC cell is still a real DAC cell in that it converts input digital data values into analog values, in the system shown in FIG. 11, the auxiliary DAC cell effectively functions as a feedback divider by means of providing to the auxiliary DAC cell such an input data signal (digital) that, when the auxiliary DAC cell converts the digital input signal to an analog signal provided at its output, the analog signal has a frequency equal to the frequency of the high speed clock generated by the VCO divided by M and a phase of such an output signal can be compared to the phase of the PLL input reference clock by the phase detector B. An appropriate input signal for the auxiliary DAC cell L is generated by the datapath pilot generator Q and is provided as a digital input signal indicated as Reference Frequency Pilot Pattern 1110 in FIG. 11.

The functionality of the datapath pilot generator Q has three aspects.

One aspect is that it generates the reference frequency pilot pattern for the auxiliary DAC cell L, as described above. To that end, the datapath pilot generator Q may use a clock signal 1116 received from a system clock divider S (which may but does not have to be implemented on the same chip/die as the rest of the system 1100), which clock signal has a frequency lower than system clock and conducive to complex digital operation. The datapath pilot generator Q may generate a pilot as a pattern with a length of M DAC clock periods. Thus, the input pilot pattern 1110 provided to the auxiliary DAC cell is already similar to a clock signal as would be generated by the feedback divider of FIG. 10 (i.e. the frequency of output 1112 of the auxiliary DAC will not be different from that of the input pilot pattern 1110), but because the auxiliary DAC cell is now involved in the forward path of the PLL and because the output of the DAC is synchronized to the output of the auxiliary DAC cell, the auxiliary DAC cell will allow to control the phase of the DAC output with respect to the phase of the PLL input reference clock.

Another aspect of the functionality of the datapath pilot generator Q is that it couples a datapath input data 1114, i.e. the actual digital data that is to be converted by the main DAC T, to the main DAC T. The main DAC then functions in a conventional manner, by converting the digital input data 1114 to an analog output 1120, the operation of which is timed with the high speed clock signal 1108.

A third aspect of the datapath pilot generator Q is that it aligns both the pilot pattern 1110 and the DAC data 1114, i.e. ensures that these signals are synchronized.

Unlike the PLL shown in FIG. 10, both the clock path H and the auxiliary DAC L are in the PLL forward path. PLL forward path may be considered to end after the auxiliary DAC L, i.e. PLL feedback path begins with the output of the auxiliary DAC cell L, shown in FIG. 11 as an output 1112. Because the clock path H and the auxiliary DAC cell L are in the PLL forward path, their drift components will be suppressed by the PLL action, i.e. by the action of the PLL attempting to generate an output signal, in this case the output of the auxiliary DAC cell, whose phase is related to the phase of a PLL input signal, in this case the PLL reference clock signal 1102. Given the delays of receiver A and replica receiver K match, then the output of the auxiliary DAC cell L will track the input to the receiver A, i.e. the low speed reference clock provided as an input to the PLL.

In other words, the PLL will try to adjust the high speed clock produced by its VCO until the phase of the output of the auxiliary DAC cell L is related to the phase of the PLL input reference clock in a predefined relation, e.g. the phases are aligned. Because that high speed clock is also used as a clock signal for the main DAC T and because the input data to the main DAC T is aligned to the input data provided to the auxiliary DAC cell L (i.e. the pilot pattern 1110), the output analog data generated by the main DAC will have the same phase relation to the phase of the PLL input reference clock as the output of the auxiliary DAC cell, successfully establishing control of the phase of the output of the main DAC with respect to the phase of the PLL reference clock.

Walking through the parts of the system 1100, first digital data 1114 to be converted by the main DAC is aligned to the system divided clock 1116 by the datapath pilot generator Q. The datapath pilot generator Q also generates a reference pilot pattern 1110 relative to the system clock and aligns it the input data 1114. The main DAC data 1114 and the pilot 1110, in alignment, are sent to the main DAC and the auxiliary DAC cell, respectively. Because the auxiliary DAC is in the forward path of the PLL, the PLL forces the auxiliary DAC output, provided as a feedback clock 1104 to the phase detector B of the PLL, to have a phase that is aligned to the input clock reference 1102, which may be considered as an input reference clock signal for the main DAC. The output analog data 1120 generated by the main DAC is, in turn, aligned to the PLL reference clock. If multiple DACs are configured to function in this manner, then all DACs' input data coupled through to the main DAC outputs will be synchronized to the phases of each DAC's input reference clock. Given that all input reference clocks are matched, the outputs of these different DACs will also be matched.

By the action of the PLL, the frequency of the pilot clock signal generated by the auxiliary DAC cell will match the frequency of the input reference clock 1102 of the PLL. Multiple systems as shown in FIG. 11 will be aligned to a master timing signal which has a period greater than or equal to that of the reference clock of the PLL. By using this external master timing reference, dividers in the datapath can reproduce this timing signal within the device by way of sampling the external master reference with the slow PLL reference clock and resetting internal dividers. The datapath pilot generator will align input data, time stamped by the master timing reference, with the internal timing reference. It will also align the pilot pattern 1110 to the internal timing reference. By doing so, the pilot will be aligned to the master timing reference by way of the time stamp on the input data. As the input data goes to the main DAC and the pilot—to the auxiliary DAC cell, the input time stamp will be aligned to the auxiliary DAC cell and hence to the PLL reference clock signal for all DACs. The time stamp is what will be used in the digital to align all system data across multiple DACs.

As described above, environmental changes can lead to drift in the charge pump C leading to overall system drift. Therefore, in some embodiments, the system 1100 may include the drift phase detector O in conjunction with a controller P, in order to control operation of digitally controlled variable current sources C1 and C2 of the charge pump C and suppress drift differences between the two inputs to the phase detector O. Operation of the drift phase detector O and the control logic P is described in greater detail below, with reference to solution #2 shown in FIG. 12, which description is also applicable to solution shown in FIG. 11.

Solution #2: Auxiliary DAC Cell Used to Externally Control Clock-Multiplying PLL FIG. 12 illustrates a system 1200 comprising a clock-multiplying PLL with a phase compensation loop, the elements that contribute to the functionality of the phase compensation loop comprising those elements shown in FIG. 12 that are not shown in FIG. 10. Thus, FIG. 12 shows a more general alternative embodiment where a phase compensating loop is added to a clock-multiplying PLL similar to that shown in FIG. 10 to track and eliminate drift between the PLL input reference clock input and DAC output.

Again, general operational principles of a clock-multiplying PLL as provided above with reference to FIG. 10 are applicable to the PLL of FIG. 12 and, therefore, in the interest of brevity are not repeated in all details. Rather, modifications to the PLL of FIG. 10 in order to allow drift tracking are described.

Similar to FIG. 10, FIG. 12 illustrates that a clock-multiplying PLL receives a low speed PLL reference clock signal 1202 and provides it to an input buffer A which couples the PLL reference clock 1202 to a phase detector B. The phase detector B compares the phase of the coupled reference clock 1202 with the phase of a PLL feedback clock 1204 generated based on the output of the feedback divider F and, as a result of the comparison, generates and provides to a charge pump C an UP pump signal indicated as "UP" and a DOWN pump signal indicated as "DWN". The charge pump C converts the difference between the UP and DWN signals to a charge by actuating two current switches C3 and C4 respectively steering currents C1 and C2.

Similar to FIG. 10, the charge generated by the charge pump of FIG. 12 is deposited onto a loop filter D and the output of the loop filter D is coupled to a VCO E where it determines the oscillation frequency of the VCO. Also similar to FIG. 10, the VCO E of FIG. 12 generates a VCO output clock signal, shown as a an output 1206, based on the input voltage received from the loop filter D, where the frequency of the VCO output signal 1206, $f_{VCO}$, is M times higher than the frequency of the PLL reference clock signal 1202, $f_{REF}$, the VCO output signal 1206 being coupled to a clock path H, thus providing a high speed clock signal 1208 that has frequency that is M times higher than that of the PLL input reference clock signal 1202.

In contrast to FIG. 10, the charge pump C of the system 1200 of FIG. 12 is a variable current charge pump to allow individual control over the currents C1 and C2 based on a charge pump control signal 1218 described in greater detail below. Tuning of the currents C1 and C2 allows control over the phase difference between the PLL reference clock 1202 and the feedback clock 1204. Also in contrast to FIG. 10, the delay G in the system 1200 of FIG. 12 is variable, so that the phase of the VCO output 1206 can be directly modified.

A phase compensating loop of the embodiment shown in FIG. 12 includes an auxiliary DAC L, a replica clock receiver K, a pilot feedback path J, a reference feed forward path I, a drift phase detector O, and control logic P. Discussions provided with reference to FIG. 11 regarding the auxiliary DAC cell and the clock receiver K being replicas are applicable here and, therefore, in the interest of brevity, not repeated. Furthermore, discussions provided with reference to FIG. 11 regarding the reference frequency pilot pattern 1210, the output of the auxiliary DAC 1212, the main DAC T, the datapath pilot generator Q and their functionality are also applicable here to a large extent and only differences with respect to FIG. 11 are described.

As in FIG. 11, the datapath pilot generator Q will align the input data 1214 to the output of the system clock divider S, generate a pilot pattern 1210 relative to the input from the divider S, and align the input data 1214 to the pilot pattern 1210. DAC data 1214, now aligned with the pilot pattern 1210, will be sent to the main DAC T while the pilot signal 1210 will be sent to the auxiliary DAC L. The auxiliary DAC L will output an analog version of the pilot signal 1210 to K and J which are a delay matched replica of the reference feed-forward path comprising receiver A and path I (it should be noted that paths with elements I and J shown in FIG. 12 may also present in FIG. 11, although now shown specifically there, and their explanations provided with reference to FIG. 12 are applicable to FIG. 11). Because these two paths (i.e. one path comprising A and I and the other path comprising K and J) match on another, their drift components are cancelled. The outputs of these two paths are compared by the digital drift phase detector O. The drift phase detector output is passed to the control logic P. In some embodiments, the control logic P may be configured to average numerous phase detections to determine in which direction the phase of the PLL output needs to be adjusted. The control logic will be used to control both the currents of the charge pump (C1 and C2) as well as the variable delay G, by generating, respectively, a charge pump delay control signal 1218 and a feedback delay control signal 1222. When locked, the output of the auxiliary DAC cell will be phase aligned to the input reference clock 1202. Since, by design, the main DAC and the auxiliary DAC cell are phase synchronized to one another, the phase of the DAC output 1220 will also be aligned to the input reference clock 1202.

It should be noted that, in some implementations, tuning of the variable current charge pump C and variable delay G may be limited in range. Therefore, some embodiments may include performing a coarse alignment of the output of the auxiliary DAC cell and the PLL reference clock before tracking. In an embodiment, the variable divider S may be used for this purpose. In such an embodiment, the control logic P used by the phase compensation loop could further be configured to control the variable divider S in that the control logic P may be configured to modify the division factor of the variable divider S to be either M or M+X, where X is an adjustment factor selected so that the auxiliary DAC cell output is delayed until it is roughly aligned with the PLL input reference clock. The adjustment of X will not change the alignment of the pilot and data signals in the datapath pilot generator Q so the synchronization of the main DAC and the auxiliary DAC cell will remain. Once this coarse tuning phase is complete, fine tuning as described above can commence.

Exemplary DAC System

Figure 13:
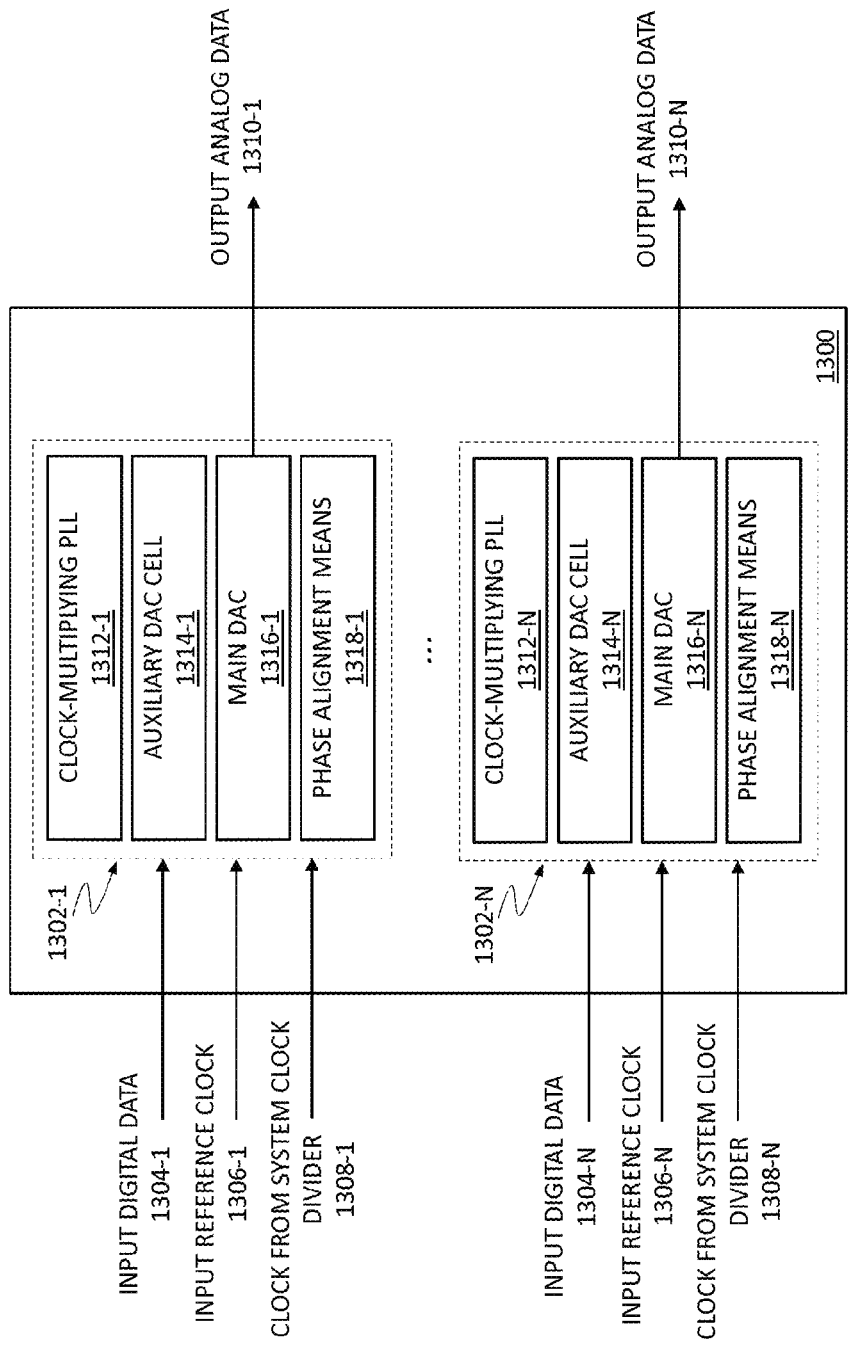
FIG. 13 illustrates a system comprising a plurality of DACs, according to various embodiments of the present disclosure.

FIG. 13 illustrates a schematic functional system view of an exemplary apparatus 1300 comprising N systems 1302, shown as systems 1302-1 through 1302-N, where N is an integer greater than one. Each of the systems 1302 could be implemented as the system 1100 of FIG. 11 or the system 1200 of FIG. 12. As shown in FIG. 13, each system 1302 is configured to receive at least input digital data 1304 to be converted by the main DAC of that system into analog output, a low speed PLL reference clock 1306, and, optionally, a clock from the system clock divider 1308 (as that provided by the system divider S described herein). As also shown, each system 1302 is configured to generate output analog data 1310-1. Each system 1302 includes functionality to implement a clock-multiplying PLL 1312, an auxiliary DAC cell 1314, a main DAC 1316 (the main DAC 1316 comprises a plurality of DAC cells and the auxiliary DAC cell 1314 is a replica of one of those DAC cells, as described herein), and phase alignment means 1318. The clock-multiplying PLL 1312 is configured to receive the PLL input reference clock signal 1306 and generate an output clock signal having a frequency greater than that of the PLL reference clock signal. In turn, the output clock signal generated by the PLL is configured to time operation of each of the plurality of DAC cells of the main DAC 1316 and of the auxiliary DAC cell 1314. The phase alignment means 1318 are configured for controlling a phase of an output generated by each of the main DAC 1316 (i.e. the output 1310) and the auxiliary DAC cell 1314 to be at a predefined phase difference from a phase of the PLL reference clock signal 1306.

Depending on whether the system 1302 implements solution #1 or solution #2 described herein, the clock-multiplying PLL 1312 and the phase alignment means 1318 may be configured to function differently. For both solutions, the phase alignment means 1318 could be considered to include a datapath pilot generator configured to provide a reference pilot signal as an input to the auxiliary DAC cell 1314 and further configured to provide, to the main DAC 1316, the digital input data signal aligned to the reference pilot signal, the digital data signal comprising input data 1304 to be converted from the digital to the analog format by the main DAC 1316. In such implementation, controlling the phase of the output generated by each of the main DAC and the auxiliary DAC cell to be at the predefined phase difference from the phase of the PLL reference clock signal would include controlling the phase of the output generated by the auxiliary DAC cell based on the reference pilot signal (namely, aligning the phase of the output of the auxiliary DAC cell with the phase of the PLL reference clock). However, for the solution #1, the auxiliary DAC cell 1314 would be included within the clock-multiplying PLL 1312 (namely, in its forward path), effectively functioning as a feedback divider, while, for the solution #2, the auxiliary DAC cell 1314 would be included in a phase compensation loop for externally controlling the clock-multiplying PLL 1312.

For both solutions, in some embodiments, the clock-multiplying PLL 1312 could include a variable current charge pump comprising a first and a second current sources (C1 and C2 in the FIGUREs). In such embodiments, controlling the phase of the output generated by each of the main DAC and the auxiliary DAC cell to be at the predefined phase difference from the phase of the PLL reference clock signal could include individually adjusting one of more of a current generated by the first current source and a current generated by the second current source to control the phase of the output generated by the auxiliary DAC cell 1314.

For solution #2, the clock-multiplying PLL 1312 could further include a variable delay element, as well as a feedback divider and a phase detector. The feedback signal generated by the feedback divider could be configured to be provided to the variable delay element prior to being provided to the phase detector. In such embodiments, controlling the phase of the output generated by each of the main DAC and the auxiliary DAC cell to be at the predefined phase difference from the phase of the PLL reference clock signal could include adjusting a delay applied by the variable delay element to the feedback signal provided from the feedback divider to control the phase of the output generated by the auxiliary DAC cell. In some further embodiments of solution #2 such a system 1302 could further include a drift phase detector and a control logic. The drift phase detector could be configured to compare a result of the PLL input clock signal having traversed an input clock receiver and a reference feed forward path with a result of the output generated by the auxiliary DAC cell having traversed a pilot receiver and a reference pilot signal feedback path, the pilot receiver and the reference pilot signal feedback path being a delay-matched replica of the input clock receiver and the reference feed forward path. The control logic could be configured to adjust one or more of the current generated by the first current source, the current generated by the second current source, and the delay applied by the variable delay element to the feedback signal based on the comparison performed by the drift phase detector. The control logic could be configured to perform the adjustment based on averaging multiple comparisons performed by the drift phase detector.

For solution #1, the system 1302 could also further include a drift phase detector and a control logic. The drift phase detector could be configured to compare a result of the PLL reference clock signal having traversed an input clock receiver with a result of the output generated by the auxiliary DAC cell having traversed a pilot receiver, the pilot receiver being a delay-matched replica of the input clock receiver. The control logic could be configured to adjust the current generated by the first current source and/or the current generated by the second current source based on the comparison performed by the drift phase detector.

In some embodiments, all of the components of the solutions #1 and #2 could be provided on the same die. The, the low speed PLL reference clock and the datapath input would then typically be provided to the die from outside the die and the analog output from the main DAC would be provided to one or more components outside of the die. In some other embodiments, all of the components of the PLL would be provided on the same die while the main DAC together with the auxiliary DAC would be provided on another die. The phase detectors could also be provided on a separate die.

Exemplary Data Processing System

Figure 14:
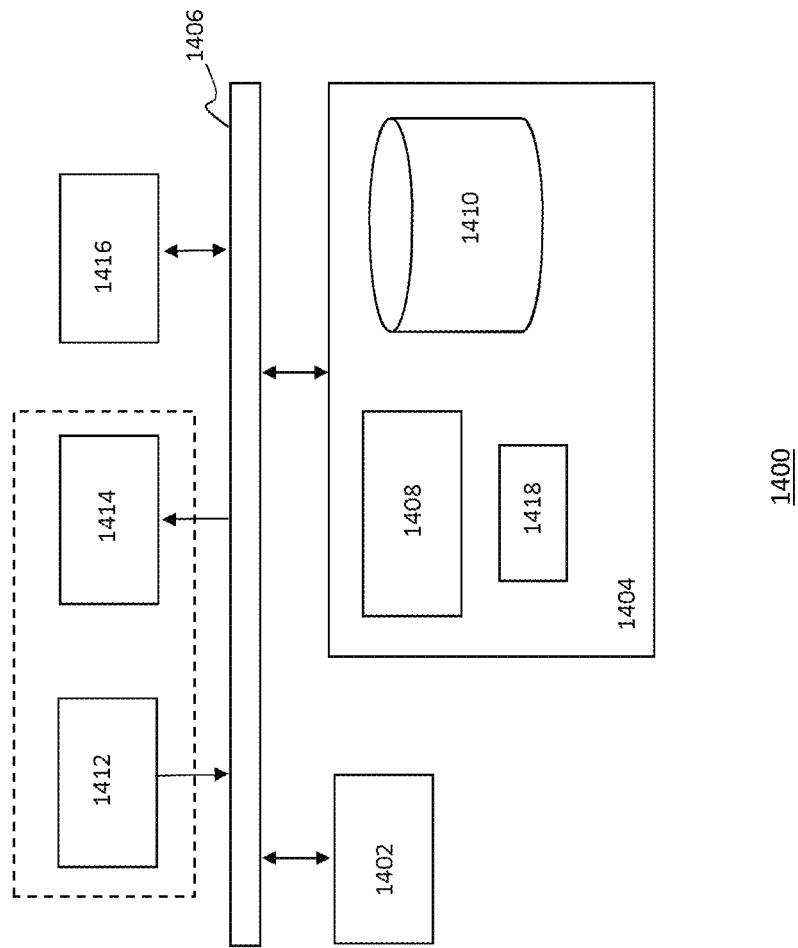
FIG. 14 depicts a block diagram illustrating an exemplary data processing system, according to some embodiments of the present disclosure.

FIG. 14 depicts a block diagram illustrating an exemplary data processing system 1400, according to one embodiment of the present disclosure. Such a data processing system could be configured to e.g. function as the controller logic described herein or as any other system configured to implement various DAC-PLL phase alignment techniques described herein.

As shown in FIG. 14, the data processing system 1400 may include at least one processor 1402 coupled to memory elements 1404 through a system bus 1406. As such, the data processing system may store program code within memory elements 1404. Further, the processor 1402 may execute the program code accessed from the memory elements 1404 via a system bus 1406. In one aspect, the data processing system may be implemented as a computer that is suitable for storing and/or executing program code. It should be appreciated, however, that the data processing system 1400 may be implemented in the form of any system including a processor and a memory that is capable of performing the functions described within this specification.

The memory elements 1404 may include one or more physical memory devices such as, for example, local memory 1408 and one or more bulk storage devices 1410. The local memory may refer to random access memory or other non-persistent memory device(s) generally used during actual execution of the program code. A bulk storage device may be implemented as a hard drive or other persistent data storage device. The processing system 1400 may also include one or more cache memories (not shown) that provide temporary storage of at least some program code in order to reduce the number of times program code must be retrieved from the bulk storage device 1410 during execution.

Input/output (I/O) devices depicted as an input device 1412 and an output device 1414, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 14 with a dashed line surrounding the input device 1412 and the output device 1414). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1416 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1400, and a data transmitter for transmitting data from the data processing system 1400 to said systems, devices and/or networks. Modems, cable modems, and Ethernet cards are examples of different types of network adapter that may be used with the data processing system 1400.

As pictured in FIG. 14, the memory elements 1404 may store an application 1418. In various embodiments, the application 1418 may be stored in the local memory 1408, the one or more bulk storage devices 1410, or apart from the local memory and the bulk storage devices. It should be appreciated that the data processing system 1400 may further execute an operating system (not shown in FIG. 14) that can facilitate execution of the application 1418. The application 1418, being implemented in the form of executable program code, can be executed by the data processing system 1400, e.g., by the processor 1402. Responsive to executing the application, the data processing system 1400 may be configured to perform one or more operations or method steps described herein.

Selected Examples

Some further Examples in accordance with various embodiments of the present disclosure are now described.

Example 1 provides a system including a main DAC including a plurality of DAC cells, an auxiliary DAC cell including a replica of one of the plurality of DAC cells, a clock-multiplying PLL configured to receive a PLL reference clock signal and generate an output clock signal having a frequency greater than that of the PLL reference clock signal, where the output clock signal is configured to time operation of each of the plurality of DAC cells and of the auxiliary DAC cell, and phase alignment means for controlling a phase of an output generated by each of the DAC and the auxiliary DAC cell to be at a predefined phase difference from a phase of the PLL reference clock signal.

Example 2 provides the system according to Example 1, where the phase alignment means includes a datapath pilot generator configured to provide a reference pilot signal as an input to the auxiliary DAC cell and further configured to provide, to the main DAC, a digital data signal aligned to the reference pilot signal, the digital data signal including input data to be converted from the digital to the analog format by the DAC, where controlling the phase of the output generated by each of the main DAC and the auxiliary DAC cell to be at the predefined phase difference from the phase of the PLL reference clock signal includes controlling the phase of the output generated by the auxiliary DAC cell based on the reference pilot signal (namely, aligning the phase of the output of the auxiliary DAC cell with the phase of the PLL reference clock).

Example 3 provides the system according to Example 2, where the clock multiplying PLL includes a charge pump including a first and a second current sources (C1 and C2 in the FIGUREs), and where controlling the phase of the output generated by each of the main DAC and the auxiliary DAC cell to be at the predefined phase difference from the phase of the PLL reference clock signal includes individually adjusting one of more of a current generated by the first current source and a current generated by the second current source to control the phase of the output generated by the auxiliary DAC cell.

Example 4 provides the system according to Example 3, where the clock multiplying PLL further includes a feedback divider, a variable delay element, and a phase detector, where a feedback signal generated by the feedback divider is configured to be provided to the variable delay element prior to being provided to the phase detector, and where controlling the phase of the output generated by each of the main DAC and the auxiliary DAC cell to be at the predefined phase difference from the phase of the PLL reference clock signal further includes adjusting a delay applied by the variable delay element to the feedback signal provided from the feedback divider to control the phase of the output generated by the auxiliary DAC cell.

Example 5 provides the system according to Example 4, further including a drift phase detector and a control logic, where the drift phase detector is configured to compare a result of the PLL input clock signal having traversed an input clock receiver and a reference feed forward path with a result of the output generated by the auxiliary DAC cell having traversed a pilot receiver and a reference pilot signal feedback path, the pilot receiver and the reference pilot signal feedback path being a delay-matched replica of the input clock receiver and the reference feed forward path, and the control logic is configured to adjust one or more of the current generated by the first current source, the current generated by the second current source, and the delay applied by the variable delay element to the feedback signal based on the comparison performed by the drift phase detector.

Example 6 provides the system according to Example 5, where the control logic is configured to perform the adjustment based on averaging multiple comparisons performed by the drift phase detector.

Example 7 provides the system according to Example 2, where the auxiliary DAC cell and a clock path of the output clock signal are provided in a forward path of the clock multiplying PLL. Because the auxiliary DAC cell is provided in the forward path and by means of receiving a suitable reference pilot signal, the auxiliary DAC cell effectively acts as a feedback divider of conventional clock multiplying PLLs, thus replacing the feedback divider. Because the clock path of the output clock signal is provided in the forward path of the PLL, phase delay through this component may be compensated by the intrinsic action of the PLL.

Example 8 provides the system according to Example 3, further including a drift phase detector and a control logic, where the drift phase detector is configured to compare a result of the PLL reference clock signal having traversed an input clock receiver with a result of the output generated by the auxiliary DAC cell having traversed a pilot receiver, the pilot receiver being a delay-matched replica of the input clock receiver, and the control logic is configured to adjust the current generated by the first current source and/or the current generated by the second current source based on the comparison performed by the drift phase detector.

Example 9 provides the system according to any one of the preceding Examples, where the output generated by the DAC is synchronized to the output generated by the auxiliary DAC cell.

Example 10 provides a method to configure a system to function according to any one of the preceding Examples.

Example 11 provides one or more non-transitory tangible media encoding logic that include instructions for execution that, when executed by a processor, are operable to perform operations for controlling a phase of an output generated by a DAC to be at a predefined phase difference from a phase of a PLL reference clock signal, the operations comprising operations of the method configuring a system to function according to any one of the preceding Examples.

Example 12 provides a system comprising means for implementing a method configuring a system to function according to any one of the preceding Examples.

Example 13 provides a data structure for assisting implementation of the method according to any one of the preceding Examples.

Variations and Implementations

While embodiments of the present disclosure were described above with references to exemplary implementations as shown in FIGS. 1-14, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to DAC-PLL phase alignment.

Parts of various systems for implementing DAC-PLL phase alignment techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGS. 1-14 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 1-14 may be implemented as stand-alone modules (e.g., a device with associated components and circuitry configured to perform a specific application or function) or implemented as plug-in modules into application specific hardware of electronic devices. Note that particular embodiments of the present disclosure implementing DAC-PLL phase alignment techniques may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of DAC-PLL phase alignment techniques proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 1-14 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGS. 1-14 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the DAC-PLL phase alignment techniques as proposed herein illustrate only some of the possible functions that may be executed by, or within, system illustrated in FIGS. 1-14. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Although the claims are presented in single dependency format in the style used before the USPTO, it should be understood that any claim can depend on and be combined with any preceding claim of the same type unless that is clearly technically infeasible.

Note that all optional features of the apparatus described above may also be implemented with respect to the method or process described herein and specifics in the examples may be used anywhere in one or more embodiments.

What is claimed is:

1. A system comprising:
   a digital-to-analog converter (DAC) comprising a plurality of DAC cells;
   an auxiliary DAC cell comprising a replica of one of the plurality of DAC cells;
   a clock-multiplying phase locked loop (PLL) configured to receive a PLL reference clock signal and generate an output clock signal having a frequency greater than that of the PLL reference clock signal, wherein the output clock signal is configured to time operation of each of the plurality of DAC cells and of the auxiliary DAC cell; and
   phase alignment means for controlling a phase of an output generated by each of the DAC and the auxiliary DAC cell to be at a predefined phase difference from a phase of the PLL reference clock signal.

2. The system according to claim 1, wherein the phase alignment means comprises:
   a datapath pilot generator configured to provide a reference pilot signal as an input to the auxiliary DAC cell and further configured to provide, to the DAC, a digital data signal aligned to the reference pilot signal, wherein
   controlling the phase of the output generated by each of the DAC and the auxiliary DAC cell to be at the predefined phase difference from the phase of the PLL reference clock signal comprises controlling the phase of the output generated by the auxiliary DAC cell based on the reference pilot signal.

3. The system according to claim 2, wherein the clock-multiplying PLL comprises a charge pump comprising a first and a second current sources, and wherein controlling the phase of the output generated by each of the DAC and the auxiliary DAC cell to be at the predefined phase difference from the phase of the PLL reference clock signal comprises individually adjusting one of more of a current generated by the first current source and a current generated by the second current source to control the phase of the output generated by the auxiliary DAC cell.

4. The system according to claim 3,
   wherein the clock-multiplying PLL further comprises a feedback divider, a variable delay element, and a phase detector,
   wherein a feedback signal generated by the feedback divider is configured to be provided to the variable delay element prior to being provided to the phase detector, and
   wherein controlling the phase of the output generated by each of the DAC and the auxiliary DAC cell to be at the predefined phase difference from the phase of the PLL reference clock signal further comprises adjusting a delay applied by the variable delay element to the feedback signal provided from the feedback divider to control the phase of the output generated by the auxiliary DAC cell.

5. The system according to claim 4, further comprising a drift phase detector and a control logic, wherein:
   the drift phase detector is configured to compare a result of the PLL input clock signal having traversed an input clock receiver and a reference feed forward path with a result of the output generated by the auxiliary DAC cell having traversed a pilot receiver and a reference pilot signal feedback path, and
   the control logic is configured to adjust one or more of the current generated by the first current source, the current generated by the second current source, and the delay applied by the variable delay element to the feedback signal based on the comparison.

6. The system according to claim 5, wherein the control logic is configured to perform the adjustment based on averaging multiple comparisons.

7. The system according to claim 3, further comprising a drift phase detector and a control logic, wherein:
   the drift phase detector is configured to compare a result of the PLL reference clock signal having traversed an input clock receiver with a result of the output generated by the auxiliary DAC cell having traversed a pilot receiver, and
   the control logic is configured to adjust the current generated by the first current source and/or the current generated by the second current source based on the comparison.

8. The system according to claim 2, wherein the auxiliary DAC cell and a clock path of the output clock signal are provided in a forward path of the clock-multiplying PLL.

9. The system according to claim 1, wherein the output generated by the DAC is synchronized to the output generated by the auxiliary DAC cell.

10. The system according to claim 1, wherein the auxiliary DAC cell is a DAC cell provided in addition to the plurality of DAC cells.

11. A method for controlling a phase of an output generated by a digital-to-analog converter (DAC) comprising a plurality of DAC cells, the method comprising:
    using an output clock signal generated by a clock-multiplying phase locked loop (PLL), the output clock signal having a frequency greater than that of a PLL reference clock signal, to ensure that a phase of an output generated by each of the DAC and an auxiliary DAC cell is within a predefined phase difference from a phase of the PLL reference clock signal,
    wherein the auxiliary DAC cell comprises a replica of one of the plurality of DAC cells.

12. The method according to claim 11, wherein using the output clock signal generated by the clock-multiplying PLL comprises timing operation of each of the plurality of DAC cells and of the auxiliary DAC cell with the output clock signal generated by the clock-multiplying PLL.

13. The method according to claim 11, further comprising ensuring generation of the output clock signal by the clock-multiplying PLL.

14. The method according to claim 11, wherein ensuring that the phase of the output generated by each of the DAC and the auxiliary DAC cell is within the predefined phase difference from the phase of the PLL reference clock signal comprises:
    providing a reference pilot signal as an input to the auxiliary DAC cell, providing a digital data signal aligned to the reference pilot signal to the DAC, and controlling the phase of the output generated by the auxiliary DAC cell based on the reference pilot signal.

15. The method according to claim 14, wherein controlling the phase of the output generated by the auxiliary DAC cell controls the phase of the output generated by the DAC.

16. The method according to claim 14, wherein the clock-multiplying PLL comprises a charge pump comprising a first and a second current sources, and wherein ensuring that the phase of the output generated by each of the DAC and the auxiliary DAC cell is within the predefined phase difference from the phase of the PLL reference clock signal further comprises individually adjusting one of more of a current generated by the first current source and a current generated by the second current source to control the phase of the output generated by the auxiliary DAC cell.

17. The method according to claim 14, wherein:

the clock-multiplying PLL comprises a feedback divider, a variable delay element, and a phase detector;

a feedback signal generated by the feedback divider is configured to be provided to the variable delay element prior to being provided to the phase detector; and ensuring that the phase of the output generated by each of the DAC and the auxiliary DAC cell is within the predefined phase difference from the phase of the PLL reference clock signal further comprises adjusting a delay applied by the variable delay element to the feedback signal provided from the feedback divider to control the phase of the output generated by the auxiliary DAC cell.

18. The method according to claim 16, further comprising:

comparing a result of the PLL reference clock signal having traversed an input clock receiver with a result of the output generated by the auxiliary DAC cell having traversed a pilot receiver, and adjusting the current generated by the first current source and/or the current generated by the second current source based on the comparison.

19. An assembly for controlling a phase of an output generated by a digital-to-analog converter (DAC) comprising a plurality of DAC cells, the assembly comprising:

means for using an output clock signal generated by a clock-multiplying phase locked loop (PLL), the output clock signal having a frequency greater than that of a PLL reference clock signal, to ensure that a phase of an output generated by each of the DAC and an auxiliary DAC cell is within a predefined phase difference from a phase of the PLL reference clock signal, wherein the auxiliary DAC cell comprises a replica of one of the plurality of DAC cells.

20. The assembly according to claim 19, further comprising:

means for providing a reference pilot signal as an input to the auxiliary DAC cell, and means for controlling the phase of the output generated by the auxiliary DAC cell based on the reference pilot signal, wherein controlling the phase of the output generated by the auxiliary DAC cell controls the phase of the output generated by the DAC.

* * * * *